(12) United States Patent
Strange et al.

(10) Patent No.: US 6,222,126 B1
(45) Date of Patent: Apr. 24, 2001

(54) WOVEN MESH INTERCONNECT

(75) Inventors: Andrew H. Strange, North Attleboro, MA (US); Arthur Millay, Sellersville, PA (US); Leonard S. Buchoff, Huntingdon Valley, PA (US); Steven K. Mac Innes, Perkasie, PA (US); Daniel W. Rassier, Hatboro, PA (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 09/145,089

(22) Filed: Sep. 1, 1998

Related U.S. Application Data

(60) Provisional application No. 60/058,379, filed on Sep. 8, 1997.

(51) Int. Cl.$^7$ .................................................. H02G 3/00
(52) U.S. Cl. ................ 174/70 R; 174/71 R; 174/72 TR; 174/35 R; 361/816; 361/818; 442/5; 442/6; 442/19
(58) Field of Search ............................. 174/70 R, 71 R, 174/72 R, 72 TR, 35 R, 35 MS, 261; 361/816, 818; 442/5, 6, 19, 32

(56) References Cited

U.S. PATENT DOCUMENTS

| | | | |
|---|---|---|---|
| 1,697,142 | * | 1/1929 | Roller . |
| 3,627,903 | * | 12/1971 | Plummer .......................... 174/72 A |
| 4,159,394 | * | 6/1979 | Ross ................................ 174/72 TR |
| 4,684,762 | * | 8/1987 | Gladfelter ............................ 174/36 |
| 4,863,789 | * | 9/1989 | Arai ..................................... 428/253 |
| 5,028,739 | * | 7/1991 | Keyser et al. ................... 174/35 GC |
| 5,239,125 | * | 8/1993 | Savage et al. .................. 174/35 MS |
| 5,408,047 | * | 4/1995 | Wentzel ............................. 174/73.1 |

FOREIGN PATENT DOCUMENTS

| | | |
|---|---|---|
| 59-41876 | 3/1984 | (JP) . |
| 62-17074 | 1/1987 | (JP) . |
| 62-35474 | 2/1987 | (JP) . |
| 63-120399 | 8/1988 | (JP) . |
| 1-140577 | 6/1989 | (JP) . |
| 5-38773 | 5/1993 | (JP) . |
| 52-12853 | 3/1994 | (JP) . |
| 6-176624 | 6/1994 | (JP) . |
| 6-58522 | 8/1994 | (JP) . |
| 6-251819 | 9/1994 | (JP) . |
| 7-37433 | 2/1995 | (JP) . |
| 8-106939 | 4/1996 | (JP) . |

* cited by examiner

*Primary Examiner*—Kristine Kincaid
*Assistant Examiner*—W. David Walkenhorst
(74) *Attorney, Agent, or Firm*—Weingarten, Schurgin, Gagnebin & Hayes LLP

(57) ABSTRACT

An electrical interconnect includes a woven mesh in which an array of parallel wires is retained in spaced relation by a transverse array of nonconducting strands, the mesh being enclosed or encased within a resilient matrix. The conductive wires are on a close pitch to yield greater current carrying capacity and achieve a lower more stable resistance. With this construction a great number of wires are in contact with each contact pad to yield greater current carrying capacity and corresponding lower resistance. The closer pitch wires also provide greater redundancy of contact points. This structure can be custom configured in as many layers or in a variety of shapes as is desirable to achieve a given electrical performance. The woven mesh can be wrapped around a shaped substrate to provide electrical connections in a desired shape. The woven mesh interconnect can be integrated as part of a boot, wherein the boot receives an electrical device therein and the woven mesh interconnect provides electrical connection from the device within the boot to outside the boot. The woven mesh interconnect can be layered and shaped to form an interconnect which not only provides electrical interconnection but also provides a biasing force due to the shape of the device.

24 Claims, 5 Drawing Sheets

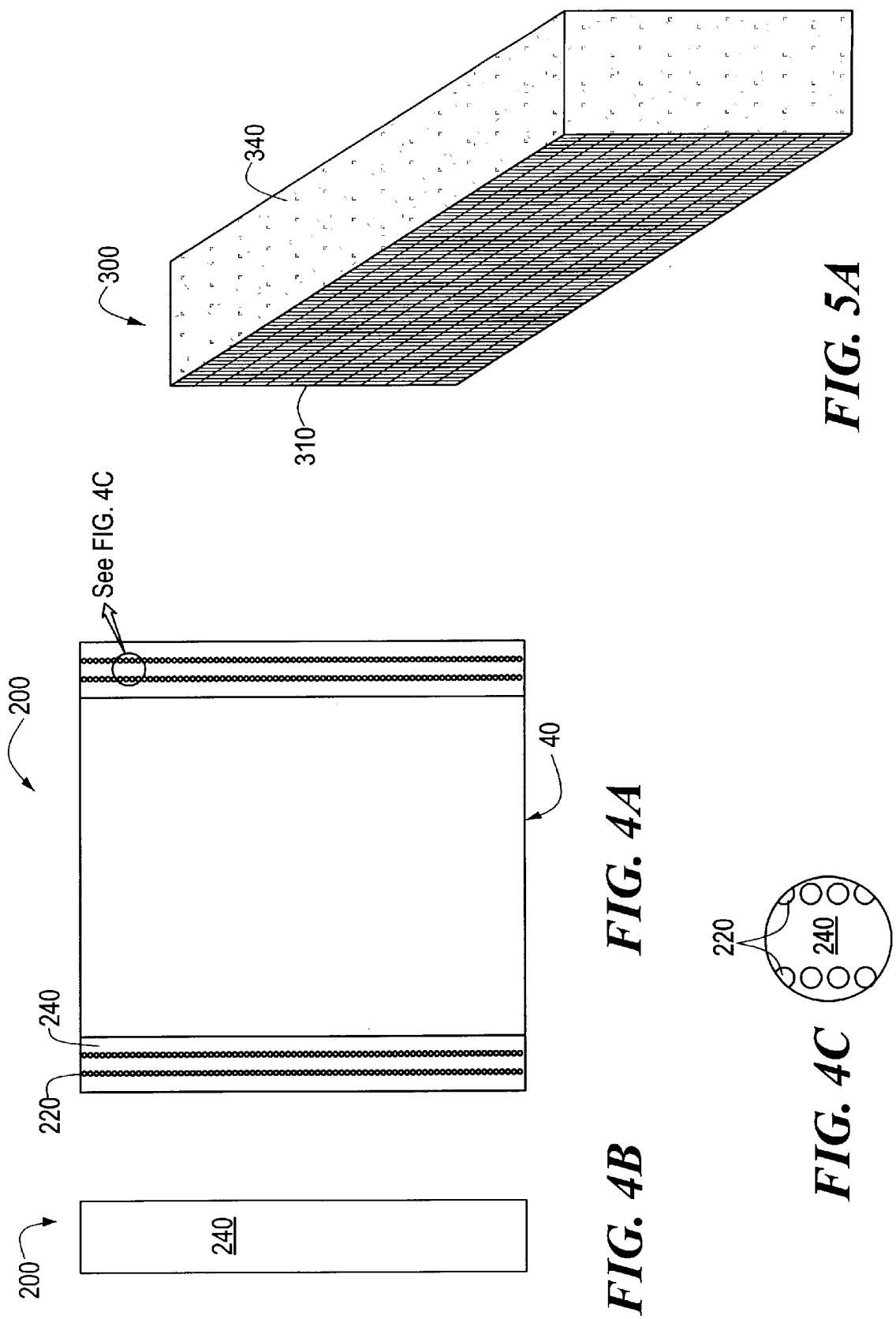

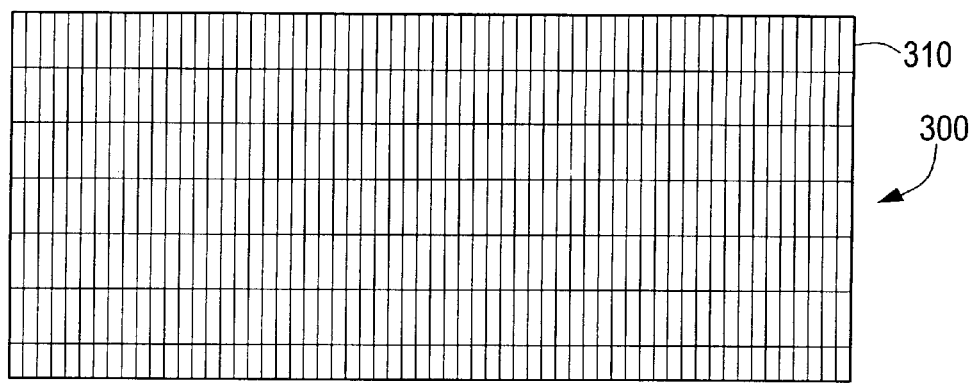
FIG. 5B
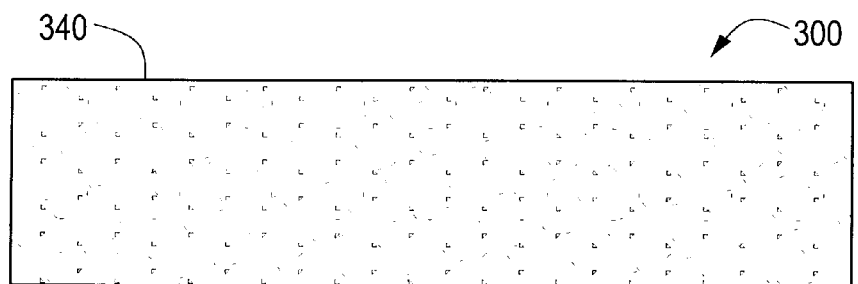
FIG. 5C
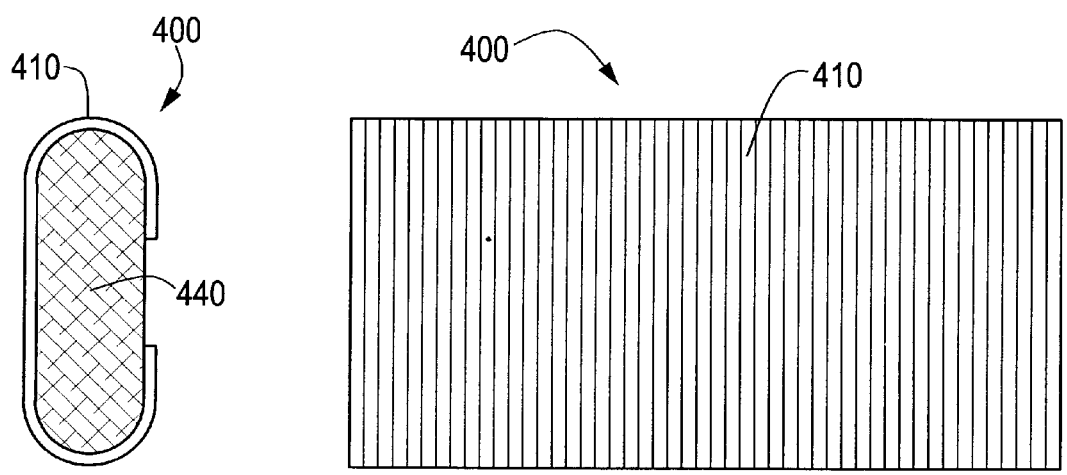
FIG. 6A          FIG. 6B

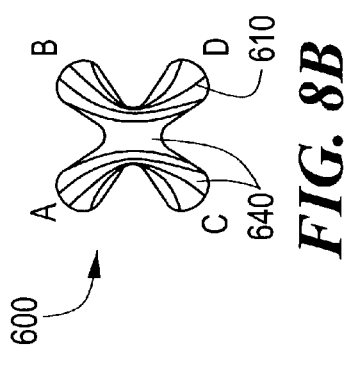
FIG. 8B
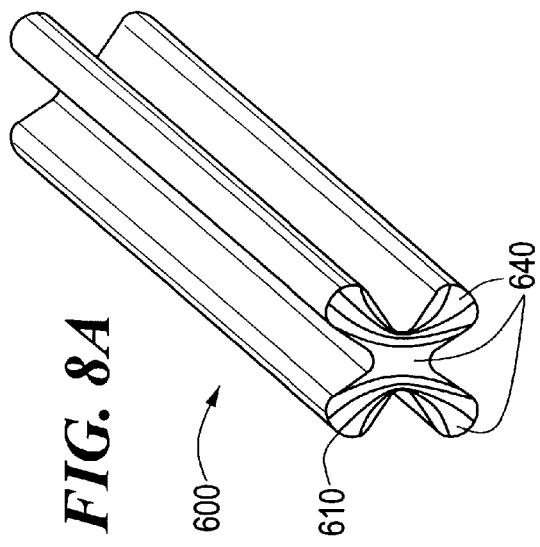
FIG. 8A
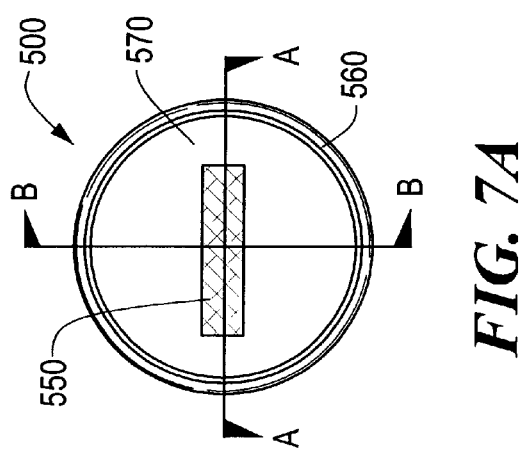
FIG. 7A
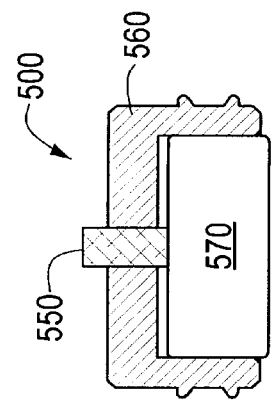
FIG. 7D SECTION B-B
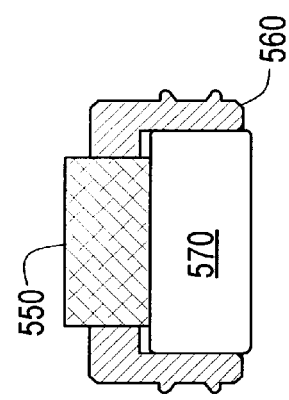
FIG. 7C SECTION A-A
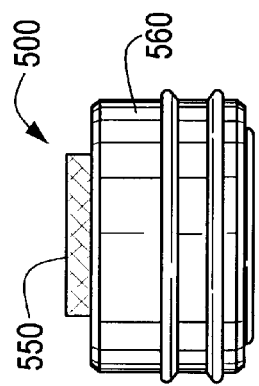
FIG. 7B

WOVEN MESH INTERCONNECT

CROSS REFERENCE TO RELATED APPLICATIONS

This application claims the benefit of Provisional Application Ser. No. 60/058,379, filed Sep. 8, 1997, which is hereby incorporated herein by reference as if set forth in full.

STATEMENT REGARDING FEDERALLY SPONSORED RESEARCH OR DEVELOPMENT

Not Applicable.

BACKGROUND OF THE INVENTION

The present invention relates generally to conductive elastomers and more particularly to a woven mesh interconnect.

Conductive elastomers are known in the art. A conductive elastomer typically comprises a non-conductive elastomeric material which has a plurality of conductive particles or flakes disposed therein. In operation, the conductive flakes or particles make an electrical connection between a device such as a packaged integrated circuit and a circuit board having electrically conductive pads or traces when the elastomer is placed between the device and the circuit board. The current carrying capacity of such an elastomer is small due to the resulting high resistance connection provided by the conductive particles of the elastomer. Further, the integrity of the connection varies from device to device since the concentration of conductive particles varies from contact to contact.

Some other conductive elastomers that are known are formed by encapsulating a plurality of conductive wires within an elastomeric material. These conductive elastomers are limited in the number of wires, the wire pitch and the number of rows of wires that can be used. These conductive elastomers also suffer from electrical and mechanical integrity problems. The wire in these elastomers require inherently high forces to assure electrical connection. Further, these wire elastomer designs exhibit a relatively large permanent deformation upon initial compression or once compressed they do not recover to the approximate initial starting height, which is referred to as compression set.

It would be desirable to have a flexible conductive elastomer which has a greater current carrying capacity as well as providing lower resistance connections and producing greater integrity of the connections.

BRIEF SUMMARY OF THE INVENTION

An electrical interconnect is comprised of a woven mesh in which an array of parallel wires is retained in spaced relation by a transverse array of nonconducting strands, the mesh being enclosed or encased within a resilient matrix. The conductive wires are on a close pitch such that a great number of wires are in contact with each contact pad to yield greater current carrying capacity and corresponding lower resistance. The closer pitch wires also provide greater redundancy of contact points. This structure can be custom configured in as many layers or in a variety of shapes as is desirable to achieve a given electrical performance or to suit an intended application. The woven mesh can be wrapped around a shaped substrate to provide electrical connections in a desired shape. The woven mesh interconnect can be integrated as part of a boot, wherein the boot receives an electrical device therein and the woven mesh interconnect provides electrical connection from the device within the boot to outside the boot. The woven mesh interconnect can be layered and shaped to form an interconnect which not only provides electrical interconnection but also provides a biasing force due to the shape of the device.

BRIEF DESCRIPTION OF THE DRAWINGS

The invention will become more fully understood from the following detailed description taken in conjunction with the accompanying drawings in which:

FIG. 4A is a top view of a third embodiment of a multilayered woven mesh interconnect;

FIG. 4B is a side view of the woven mesh interconnect of FIG. 4A;

FIG. 4C is a view of a section of the woven mesh interconnect of FIG. 4A;

FIG. 5A is an isometric view of a fourth embodiment of a woven mesh interconnect;

FIG. 5B is a front view of the woven mesh interconnect of FIG. 5A;

FIG. 5C is a top view of the woven mesh interconnect of FIG. 5A;

FIG. 6A is a top view of a fifth embodiment of a woven mesh interconnect;

FIG. 6B is a front view of the woven mesh interconnect of FIG. 6A;

FIG. 7A is a top view of a sixth embodiment of a woven mesh interconnect;

FIG. 7B is a side view of the woven mesh interconnect of FIG. 7A;

FIG. 7C is a cross-sectional side view of the woven mesh interconnect of FIG. 7A taken along line A;

FIG. 7D is a cross-sectional side view of the woven mesh interconnect of FIG. 7A taken along line B;

FIG. 8A is an isometric view of a seventh embodiment of a woven mesh interconnect; and FIG. 8B is an end view of the woven mesh interconnect of FIG. 8B.

DETAILED DESCRIPTION OF THE INVENTION

An electrical interconnect is comprised of a woven mesh in which an array of parallel wires is retained in spaced relation by a transverse array of nonconducting strands, the mesh being enclosed or encased within a resilient matrix. The structures described herein are of non-adhesive construction; that is, the wires are directly imbedded within the elastomeric matrix.

Figure 1A:
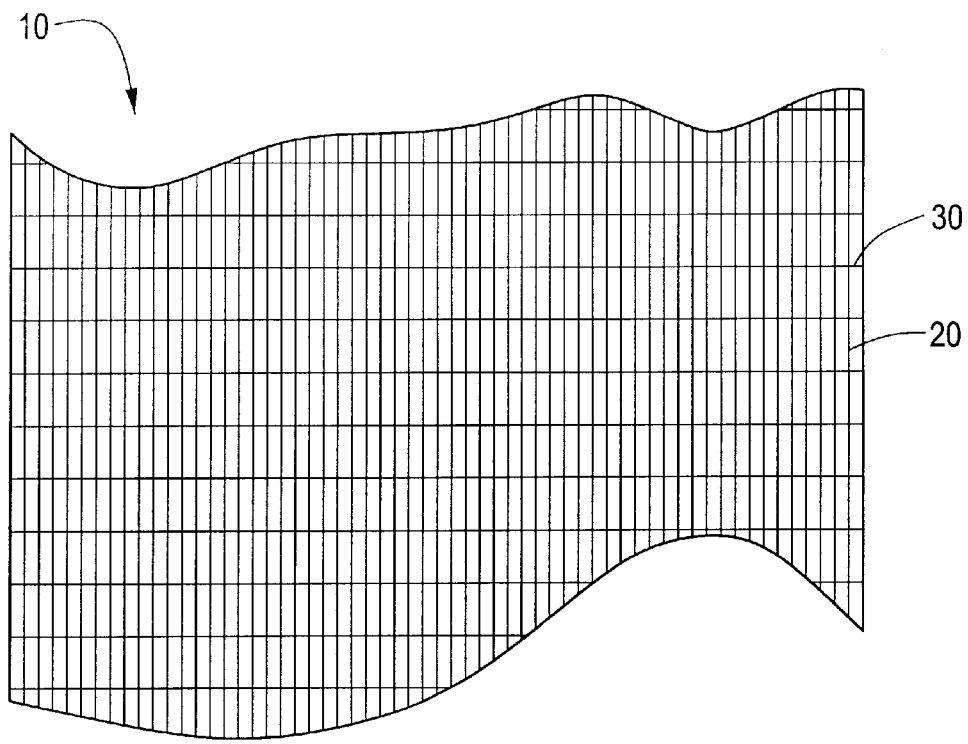
FIG. 1A is a front view of an embodiment of a woven mesh interconnect of the present invention.
Figure 1B:
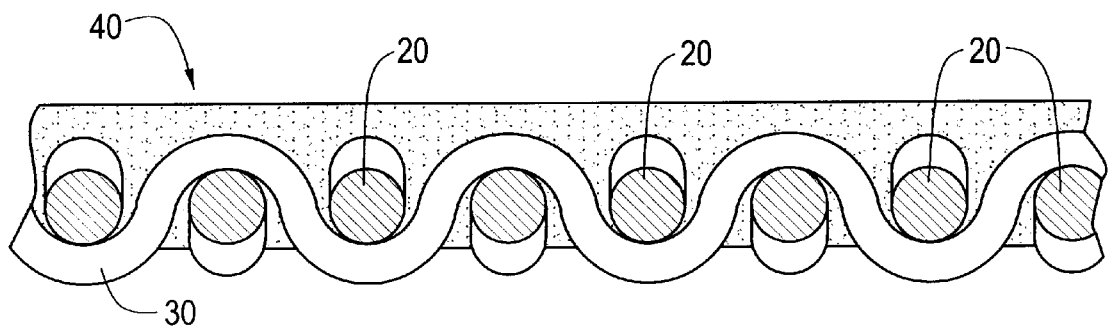
FIG. 1B is an end view of an embodiment of the woven mesh interconnect.

Referring to FIGS. 1A and 1B, a woven mesh 10 is shown. The woven mesh 10 comprises a first array of conductive wires 20 which are generally parallel with each other. The woven mesh further includes a second array of strands 30 which are nonconductive and are generally parallel with each other. The first array of conductive wires is disposed generally transverse with respect to the second array of strands, and are interwoven with the second array of strands. As shown in more detail in FIG. 1B, a single strand from the second array of strands is disposed such that the strand 30 weaves below one conductive wire 20 of the first array of wires, and then weaves above the adjacent wire of the array. The strand thus alternates being disposed above and below adjacent wires of the first array. A next strand of the array also alternates between being disposed above and below adjacent wires, but in an opposite position as an adjacent strand. For example, a first strand may be above a first wire, below a second wire, above a third wire etc., while an adjacent strand would be below the first wire, above the second wire, below the third wire, etc. Likewise, the wires 20 weave below and above the strands 30 and alternate weaving in an opposite position as an adjacent wire. Accordingly, the two arrays are interlaced and interwoven within each other forming the woven mesh. In addition, alternate weaving variations can be used, such as, weaving between every two wires and strands, every three wires and strands, etc. and any combination thereof.

The wires 20 are comprised of any conductive material and preferably of nickel, and most preferably of gold plated nickel. The strands 30 are comprised of a non-conductive material and preferably of polyester. The densities of wires and strands could be any density that forms a mesh, but most particularly about 300 wires per inch for the first array of wires and approximately 80 strands per inch for the second array of strands. In a preferred embodiment the wires and the strands each have a respective diameter of approximately 0.04 mm.

The woven mesh interconnect 50 further includes a matrix 40 for maintaining the spaced relation of the array of wires 20 with respect to each other and with respect to the interwoven array of strands 30. The matrix 40 is nonconductive and typically comprises a resilient material such as silicone rubber. In one embodiment, the matrix 40 encloses the woven mesh 10, with the end surfaces of the matrix having the ends of the first array of wires exposed such that an electrical and mechanical interconnect can be provided from a first end of the woven mesh interconnect 50 to an opposite end of the woven mesh interconnect 50. Two or more rows of mesh 10 can be provided within the same matrix to achieve greater redundancy of contacts.

In another embodiment of the invention, the woven mesh interconnect 50 provides electrical conduction along an entire side of the elastomeric matrix. For example, the matrix 40, as shown in FIG. 1B allows the wires 20 to protrude through one side of the elastomeric material 40, whereby electrical contact is made along the entire side of the matrix 40 by contacting the protruding portions of the weaving wires 20, which extend through the elastomeric matrix 40. This embodiment is well suited for making 90° connections and where a wrap around connection is desired. In this embodiment, the wires 20 can be exposed at the ends or encased within the elastomeric material.

Figure 2:
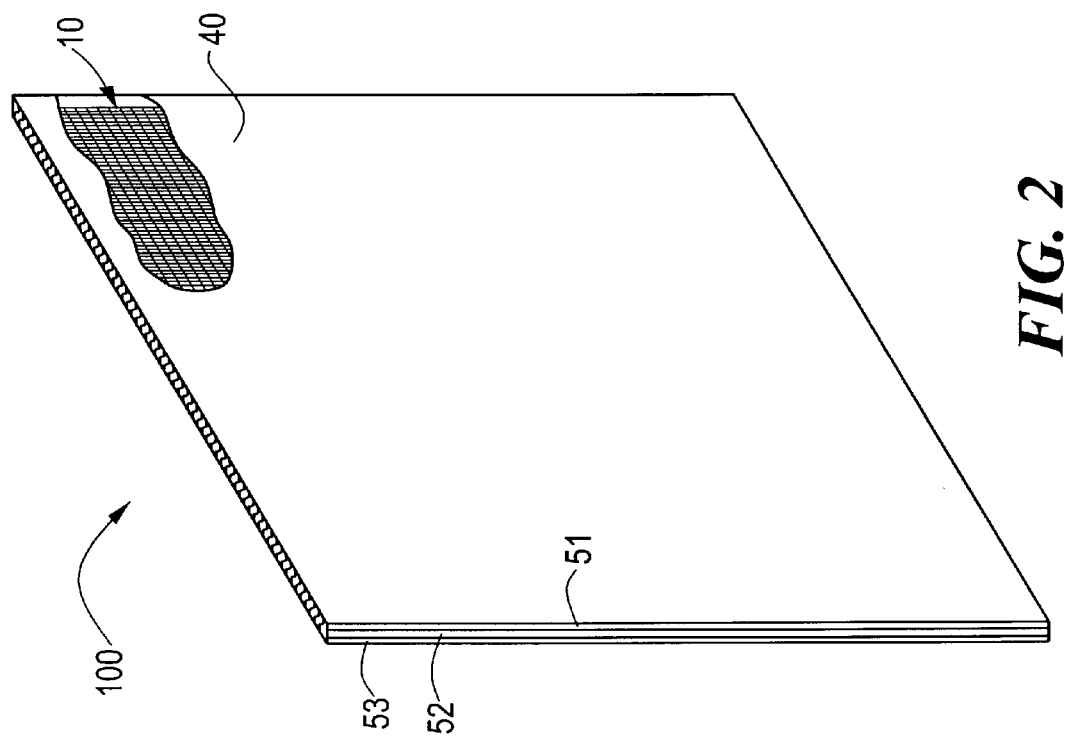
FIG. 2 is an isometric view of a multilayered sheet of woven mesh interconnect including the woven mesh of FIG. 1A.

Referring now to FIG. 2, a multilayered sheet 100 of woven mesh interconnect is shown. The multilayered sheet 100 includes three layers 51, 52, and 53 of woven mesh interconnect 50. All three layers are oriented similarly in that the array of wires of the woven mesh 10 in each layer is positioned in the same direction. While three layers are shown, it should be appreciated that any number of layers could be utilized. The sheets or webs can then be cut to intended sizes for use. Further, while the layers here are shown aligned such that the array of wires are running in the same direction on each sheet, it should be appreciated that the layers could be alternating in their alignment such that a first layer is oriented with the array of wires running in a first direction and a second layer is oriented with the array of wires running in a transverse direction with respect to the array of wires of the first layer. With such an arrangement, electrical connections are provided from a first horizontal edge of the sheet 100 to a second horizontal edge, and from a first vertical edge to a second vertical edge, while the connections of the vertical edge are isolated from the connections of the horizontal edge.

Figure 3A:
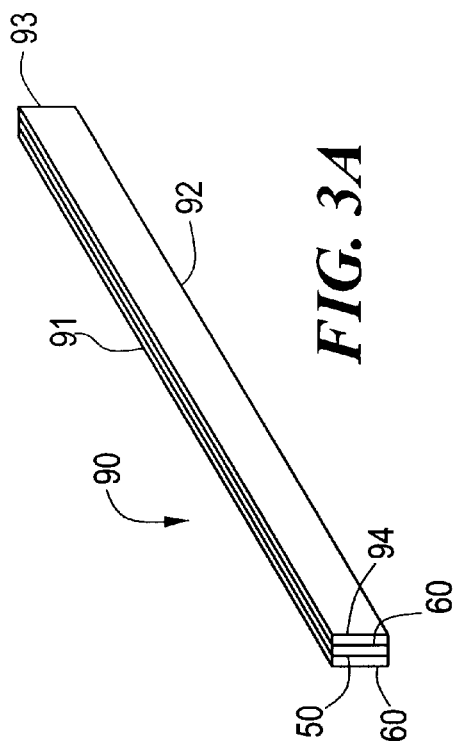
FIG. 3A is an isometric view of a second embodiment of a layered woven mesh interconnect.
Figure 3C:
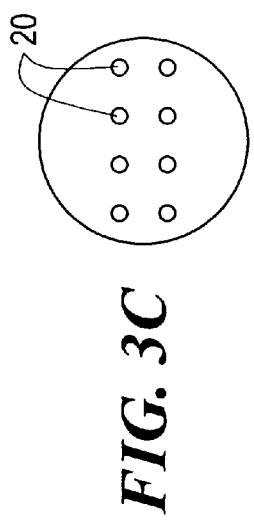
FIG. 3C is a view of a section of the woven mesh interconnect of FIG. 3A.
Figure 3B:
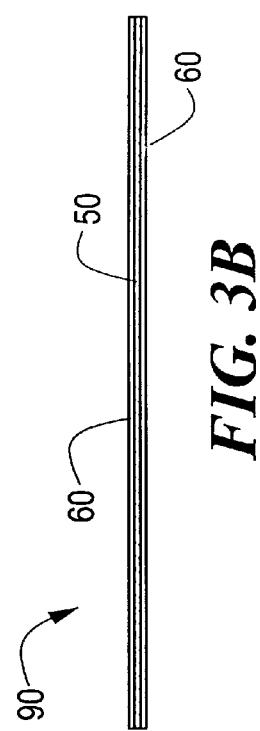
FIG. 3B is a top view of the layered woven mesh interconnect of FIG. 3A.

Referring now to FIGS. 3A–3C, a rectangular shaped woven mesh interconnect 90 is shown. In this embodiment, the woven mesh interconnect comprises a single layer of woven mesh 50, laminated on each side by a nonconductive layer of material 60. In this embodiment, and as shown in FIG. 3B and in greater detail in FIG. 3C, the woven mesh is oriented such that the array of wires 20 extend from a first horizontal or top side 91 to the opposing horizontal or bottom side 92. Further, the woven mesh in this instance comprises two arrays of conductive wires 20 within the same matrix.

As shown in FIGS. 4A–4C, an interconnect 200 is shown in which two separate rows of conductive mesh 220 are used in a sheet, and additional rows may be used to suit particular contact requirements. The conductive wires are on a close pitch to yield greater current carrying capacity and achieve a lower more stable resistance. The closer pitch wires provide greater redundancy of contact points. This structure can be custom configured in as many layers as is desirable to achieve a given electrical performance.

Referring now to FIGS. 5A–5C a further embodiment 300 is shown wherein the woven mesh interconnect 310 is attached to a piece of insulative material 340 such as an elastomeric foam. The woven mesh interconnect in this embodiment has a very thin matrix, such that the resulting woven mesh interconnect is very pliable and acts like a skin wherein it can be layered on the insulative foam or easily deformed into other shapes.

As shown in FIG. 6A the embodiment 400 comprises a wire mesh interconnect 410 which is wrapped around and bonded to an elastomeric substrate 440. The substrate 440 is comprised of a non-conductive material such as silicone rubber. The silicone rubber matrix of the mesh 410 can be integrally bonded to the substrate 440 to form an essentially integral or unitary rubber core containing an outer wrapping of embedded conductors to provide an interconnect between the opposing edge surfaces. Alternately the mesh 410 can be attached to the substrate at predetermined points, and is thus flexible with respect to the substrate.

As shown in FIGS. 7A–7D, the woven mesh interconnect 550 can be incorporated into a boot 560 or other housing which retains an electrical device 570 such as a microphone. As shown there is a rubber or other elastomeric material boot 560 which includes an opening for retaining a device 570 such as a microphone and having the mesh interconnect 550 for providing electrical interconnection from the device 570 to external circuitry. The elastomeric structure 500 provides a convenient unitary subassembly for easy mounting within a cellular telephone, for example.

Referring now to FIGS. 8A and 8B in a further embodiment the wire mesh 610 can be layered within a generally X-shaped elastomeric structure as shown in the drawing to provide conductive interconnection via the nickel or other metal wires from the outer surface of one lobe of the X-shaped structure to the outer surface of the opposing lobe. For example, the wire mesh 610 can create a conductive interconnection between lobe A and lobe C of the X-shaped structure 600 and a conductive interconnection between lobe B and lobe D of structure 600. The non-conductive resilient or elastomeric material 640, besides filling space between the wires of the conductive wire mesh 610, creates a space through the center of the X-shaped structure 600, which separates the conductive pathways created by the interconnections between lobes A and C and lobes B and D. The resilient or elastomeric material 640 also serves to provide a biasing force against spaced elements being conductively interconnected to provide good contact force. This X-shaped structure 600 can be mechanically "tuned" to eliminate the inherent high-force barrier that is common with many other interconnects which utilize wires for the conductive interconnection. The X-shaped structure 600 serves as a beam spring to distribute the stresses throughout its cross section and to provide good contact force. This structure 600 does not suffer the compression set or permanent deformation of known interconnects using an elastomeric foam. The beam spring cross section and elliptical contact shape which is provided by the wire ends extending to the contact surfaces at an angle provides efficient contact forces and minimization of mechanical stresses. This structure 600 can withstand higher mechanical cycling with less conductor breakage than known elastomeric interconnects and requires only a very low force in order to make an electrical connection. Furthermore, a wiping contact action can be achieved. Additionally, a dual row, single row, single row 90° or dual row 90° opposed interconnections are possible with the X-shaped structure 600.

The woven mesh interconnect provides greater current carrying capacity and lower resistance than traditional conductive elastomers. Additionally, the woven mesh interconnect can be formed into a variety of shapes or bonded onto shaped substrates dependent on the particular application.

Having described preferred embodiments of the invention it will now be apparent to those of ordinary skill in the art that other embodiments incorporating these concepts and various omissions and additions may be made or used. Accordingly, it is submitted that the invention should not be limited to the described embodiments but rather should be limited only by the spirit and scope of the appended claims.

What is claimed is:

1. A woven mesh interconnect comprising:
    a first array of conductive wires, each wire of said first array having a first end and a second end;
    a second array of nonconductive strands, said second array disposed transverse with said first array of wires, said second array of strands maintaining said first array of wires in a spaced relation; and
    a resilient matrix enclosing said first array of conductive wires and said second array of non-conductive strands, said resilient matrix having a first side and a second side and portions of said first array of conductive wires exposed from said resilient matrix.

2. The woven mesh interconnect of claim 1 wherein said second array of strands are interwoven about the wires of said first array of wires.

3. The woven mesh interconnect of claim 2 wherein said strands of said second array of strands interweave around every wire of said first array of wires.

4. The woven mesh interconnect of claim 2 wherein said strands of said second array of strands weave around at least two wires of said first array of wires.

5. The woven mesh interconnect of claim 1 wherein said portions comprise said first end and said second end of each wire of said first array of wires, said first end and said second end not covered by said resilient matrix and exposed for contact with a mating surface.

6. The woven mesh interconnect of claim 1 wherein said portions of said wires of said first array of wires protrude through said first side of said resilient matrix as said wires weave around said strands of said second array of strands.

7. The woven mesh interconnect of claim 1 further comprising a third array of conductive wires, each wire of said third array having a first end and a second end, said third array of wires disposed parallel with said first array of wires, said second array of strands maintaining said third array of wires in a spaced relation, and wherein said matrix also encloses said third array and wherein said first and second ends of each wire of said third array are not covered by said resilient matrix.

8. The woven mesh interconnect of claim 1 wherein said woven mesh interconnect is fabricated as a sheet of material and wherein said first array of wires extend from a first edge of said sheet to an opposing edge of said sheet.

9. The woven mesh interconnect of claim 1 wherein said first array of conductive wires comprises nickel.

10. The woven mesh interconnect of claim 1 wherein said first array of conductive wires comprise gold-plated material.

11. The woven mesh interconnect of claim 1 wherein said second array of nonconductive strands comprises polyester.

12. The woven mesh interconnect of claim 1 wherein said resilient matrix comprises silicone rubber.

13. The woven mesh interconnect of claim 1 wherein said first array of conductive wires has a density of approximately 300 wires per inch.

14. The woven mesh interconnect of claim 1 wherein said second array of nonconductive strands has a density of approximately 80 strands per inch.

15. The woven mesh interconnect of claim 1 wherein said wires of said first array of wires have a diameter of approximately 0.04 mm.

16. The woven mesh interconnect of claim 1 wherein said strands of said second array of strands have a diameter of approximately 0.04 mm.

17. The woven mesh interconnect of claim 1 further comprising a substrate, wherein at least a portion of said resilient matrix is bonded to said substrate.

18. The woven mesh interconnect of claim 1 further comprising a housing, said housing defining an opening therein, said matrix extending from the opening within said housing, through said housing and beyond said housing, said matrix disposed within said housing such that said first ends of said array of wires of said wire mesh are positioned within the opening defined by said housing, and said second ends of said wires are disposed outside of said housing, said housing configured to receive a device within said opening defined by said housing, and said wire mesh operative to provide electrical communication between a device received within said housing and an external device.

19. The woven mesh interconnect of claim 18 wherein said housing comprises molded rubber.

20. A woven mesh interconnect comprising:
    a first layer comprising:
        a first array of conductive wires, each wire of said first array of wires having a first end and a second end;
            a first array of nonconductive strands disposed transverse with said first array of wires, said first array of strands maintaining said first array of wires in a spaced relation; and a first resilient matrix encasing said first array of conductive wires and said first array of nonconductive strands, and wherein said first end and said second end of each wire of said first array of wires are not covered by said first resilient matrix; and a second layer laminated to said first layer, said second layer comprising:

a second array of conductive wires, each wire of said second array of wires having a first end and a second end;

a second array of nonconductive strands disposed transverse with said second array of wires, said second array of strands maintaining said second array of wires in a spaced relation; and a second resilient matrix encasing said second array of conductive wires and said second array of nonconductive strands, and wherein said first end and said second end of each wire of said second array of wires are not covered by said second resilient matrix.

21. The woven mesh interconnect of claim 20 wherein said conductive wires of said first layer are substantially parallel to said conductive wires of said second layer.

22. The woven mesh interconnect of claim 20 wherein said first layer is oriented in a transverse direction as said second layer.

23. The woven mesh interconnect of claim 20 wherein said interconnect is formed having a multi-lobe shape, and wherein said first array of wires extend from a first lobe of said multi-lobe shape to a second lobe of said multi-lobe shape.

24. The woven mesh interconnect of claim 23 wherein said multi-lobe shape comprises four lobes, each lobe spaced substantially equidistant apart from an adjacent lobe.

* * * * *